(12) United States Patent
Kajiyama (10) Patent No.: US 9,853,095 B2
(45) Date of Patent: Dec. 26, 2017

(54) DISPLAY DEVICE (71) Applicant: Japan Display Inc., Tokyo (JP)

(72) Inventor: Kenta Kajiyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/176,293

(22) Filed: Jun. 8, 2016

(65) Prior Publication Data

US 2016/0380037 A1 Dec. 29, 2016

(30) Foreign Application Priority Data

Jun. 25, 2015 (JP) ................. 2015-127297

(51) Int. Cl.
*H01L 27/32* (2006.01)
*H01L 27/12* (2006.01)

(52) U.S. Cl.
CPC ........ *H01L 27/3262* (2013.01); *H01L 27/322* (2013.01); *H01L 27/3211* (2013.01); *H01L 27/3246* (2013.01); *H01L 27/1214* (2013.01)

(58) Field of Classification Search
CPC ............................ H01L 27/3262; H01L 27/322
See application file for complete search history.

(56) References Cited

U.S. PATENT DOCUMENTS

| 6,313,895 B1 | 11/2001 | Tsuda et al. |
| 2006/0120160 A1 | 6/2006 | Park et al. |
| 2015/0144908 A1* | 5/2015 | Yoon .................. H01L 27/3216 |
| | | 257/40 |

FOREIGN PATENT DOCUMENTS

| JP | H10-123508 A | 5/1998 |
| JP | 2006-079104 A | 3/2006 |

* cited by examiner

*Primary Examiner* — Moazzam Hossain
*Assistant Examiner* — Farun Lu
(74) *Attorney, Agent, or Firm* — Typha IP LLC (57) ABSTRACT

A display device includes a first pixel and a second pixel arranged in a first or a second direction, each of them has a pixel electrode, a contact hole under the pixel electrode, a bank on the pixel electrode, and an opening provided in the bank and on the pixel electrode. A first imaginary line connecting the center of the contact hole of a first pixel and the center of the contact hole of a second pixel is substantially parallel to the first direction or the second direction, a second imaginary line connecting the center of the opening of the first pixel and the center of the opening of the second pixel is substantially parallel to the first direction or the second direction, and each of straight-line sides of the openings of the plurality of pixels has an angle with respect to both of the first and the second direction.

6 Claims, 9 Drawing Sheets

DISPLAY DEVICE

CROSS REFERENCE TO RELATED APPLICATIONS

This application is based upon and claims the benefit of priority from the prior Japanese Patent Application No. 2015-127297 filed on Jun. 25, 2015, the entire contents of which are incorporated herein by reference.

FIELD

The present invention relates to a display device and a method for producing the same, and an embodiment disclosed by this specification relates to a pixel structure of a display device.

BACKGROUND

An organic electroluminescence (hereinafter, referred to as "organic EL") display device includes a light emitting element provided in each of pixels and displays an image by controlling light emission of each of the light emitting elements independently. The light emitting element has a structure in which a layer containing an organic EL material (hereinafter, also referred to as a "light emitting layer") is interposed between a pair of electrodes, one of which is a lower electrode and the other of which is an upper electrode.

In such an organic EL display device, one of the electrodes is provided in each pixel as an individual pixel electrode (such an electrode is also referred to simply as a "pixel electrode"), and the other electrode is provided in correspondence with a plurality of pixels as a common pixel electrode supplied with a common potential (such an electrode is also referred to as a "common electrode"). The organic EL display device controls an electric current supplied from the individual pixel electrode in each pixel to the common pixel electrode and thus controls the light emission of the pixel.

An organic EL display device, especially, an organic EL display device realizing full-color display with a combination of a white light emitting element and color filters, generally includes an array substrate and a color filter substrate that are assembled together. The array substrate includes a plurality of light emitting elements arrayed in rows and columns. The color filter substrate includes color filters of, for example, three colors, namely, R (red), green (G) and blue (B), and a light-blocking layer (also referred to as a "black matrix") demarcating the color filters of the three colors.

Occasionally in a display device, an R (red) pixel, a G (green) pixel and a B (blue) pixel are each used as a sub pixel, and a group of these sub pixels is used as one pixel. In such display devices, various arrangements are made on a structure of pixels including the sub pixels in order to improve the display quality.

For example, Japanese Laid-Open Patent Publication No. 2006-79104 discloses a liquid crystal display device as follows. The number of driving circuit chips is decreased to lower the production cost of the display device. In order to improve the image quality, the display device includes a plurality of pixels each including a pixel electrode and a switching element connected to the pixel electrode. The pixel electrodes of the plurality of pixels are arrayed in rows and columns. The display device also includes a plurality of gate lines connected to the switching elements and extending in a row direction, and a plurality of data lines connected to the switching elements and extending in a column direction. In each of rows, at least two gate lines extend. The pixel electrodes each include a first portion and a second portion farther from the corresponding data line than the first portion. The switching elements are each located in the vicinity of the second portion of the corresponding pixel electrode.

Japanese Laid-Open Patent Publication No. Hei 10-123508 discloses a reflection-type liquid crystal display device and a method for producing the same as follows. The display device is devised to display an image with no seam even when exposure to light is performed a plurality of times at different positions. A reflective plate and a display quality mask each include a plurality of concave-and-convex patterns, each of which corresponds to one pixel. At least one type of concave-and-convex pattern is provided in the number of two or more. Any two patterns among the plurality of concave-and-convex patterns have one or a plurality of relationships among translation, rotation and inside-out inversion. The one or the plurality of relationships include translation. The concave-and-convex patterns are located irregularly. Such a mask 1a is used to expose a photosensitive resin film to produce the reflective plate having a convexed portion and the reflection-type liquid crystal display device.

SUMMARY

A display device in an embodiment according to the present invention includes a display region including a plurality of pixels arrayed in a first direction and a second direction crossing the first direction. The plurality of pixels each include at least one transistor; a pixel electrode provided on the transistor with an insulating layer being provided therebetween; a contact hole connecting a source electrode or a drain electrode of the transistor and the pixel electrode to each other; a bank provided on the pixel electrode so as to cover an end of the pixel electrode and the contact hole; and an opening provided in the bank so as to expose an end of the pixel electrode, the opening being quadrangular or polygonal with obtuse angles. A line connecting the center of the contact hole of a first pixel among the plurality of pixels and the center of the contact hole of a second pixel, among the plurality of pixels, adjacent to the first pixel in the first direction or the second direction is generally parallel to the first direction or the second direction; a line connecting the center of the opening of the first pixel and the center of the opening of the second pixel adjacent to the first pixel in the first direction or the second direction is generally parallel to the first direction or the second direction; and straight-line sides of the openings of the plurality of pixels each have an angle with respect to both of the first direction and the second direction.

DESCRIPTION OF EMBODIMENTS

Hereinafter, embodiments of the present invention will be described with reference to the drawings and the like. The present invention may be carried out in various many embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing (s) bear the identical reference signs thereto, and detailed descriptions thereof may be omitted.

In this specification, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

Regarding a self-emitting type display device such as an organic EL display device, there are problems that light emitted in a lateral direction is an invalid component and thus prevents improvement of the light extraction efficiency, and that in a system of using a white organic EL element and color filters, light emitted in the lateral direction is a cause of optical color mixing.

Herein, the expression "optical color mixing" refers to the following phenomenon. A part of light emitted almost isotropically in a transparent light emitting layer having a relatively large refractive index is totally reflected at an interface of the light emitting layer and thus does not go out of the light emitting layer. A part of the light that is output from a light emitting element is propagated in the light emitting layer, and therefore, is transmitted through a color filter of a pixel different from a pixel corresponding to the light emitting element. As a result, light of an unintended color is provided.

In light of such problems, the present invention has an object of providing a display device alleviating the optical color mixing. The present invention also has an object of providing a display device decreasing external light reflection. The present invention further has an object of providing a display device including a light-blocking layer having openings that are formed to have the same shape stably during production thereof.

Figure 1:
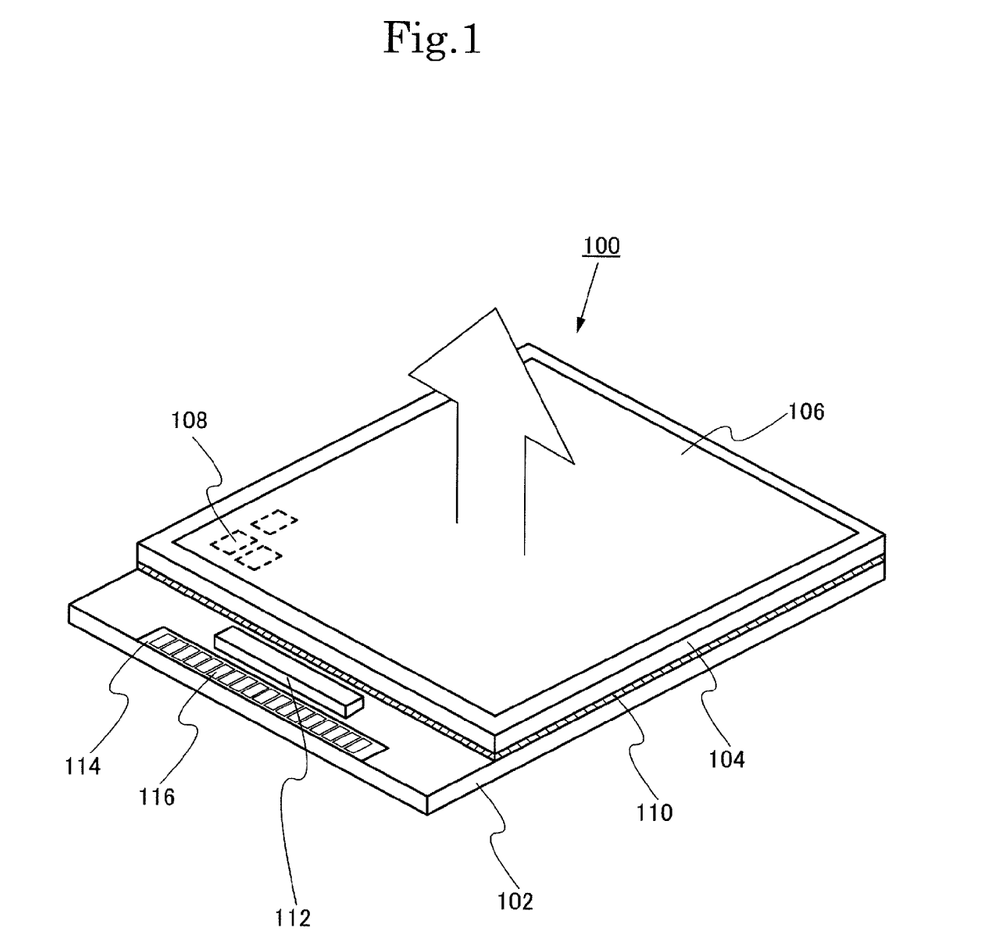
FIG. 1 is a perspective view showing a structure of a display device in an embodiment according to the present invention.

With reference to FIG. 1, a structure of a display device 100 in this embodiment will be described. The display device 100 includes a first substrate 102 having a display region 106 provided thereon. The display region 106 includes an array of a plurality of pixels 108. On a top surface of the display region 106, a second substrate 104 is provided.

The second substrate 104 is secured to the first substrate 102 by a sealing member 110 surrounding the display region 106. The display region 106 formed in the first substrate 102 is sealed by the second substrate 104 and the sealing member 110 so as not to be exposed to air. Such a sealing structure suppresses light emitting elements provided in the pixels 108 from being deteriorated. It should be noted that for merely sealing the display region 106, it is not necessary to provide the second substrate 104, and the display region 106 including the plurality of pixels 108 may be covered with a film having a high level of performance as a gas barrier.

The first substrate 102 has a terminal region 114 provided thereon along an end thereof. The terminal region 114 is located outer to the second substrate 104. The terminal region 114 includes a plurality of connection terminals 116. At each of the connection terminals 116, a wiring board connecting a device that outputs a video signal, a power supply and the like with a display panel is provided. A contact of the connection terminal 116 with the wiring board is exposed outside. The first substrate 102 may include a driver circuit 112 that outputs a video signal input from the terminal region 114 to the display region 106.

Figure 2:
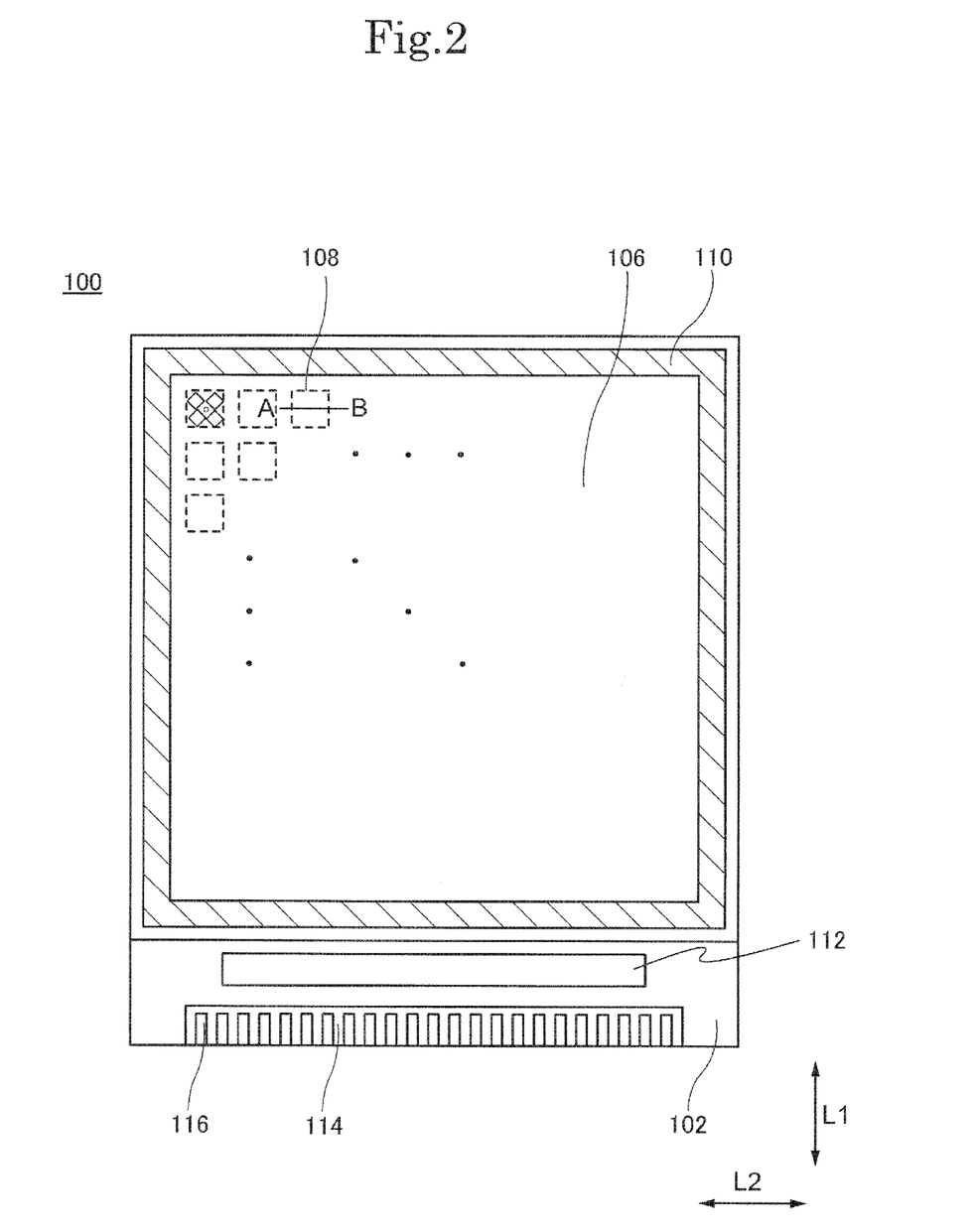
FIG. 2 is a plan view showing the structure of the display device in the embodiment according to the present invention.
Figure 3:
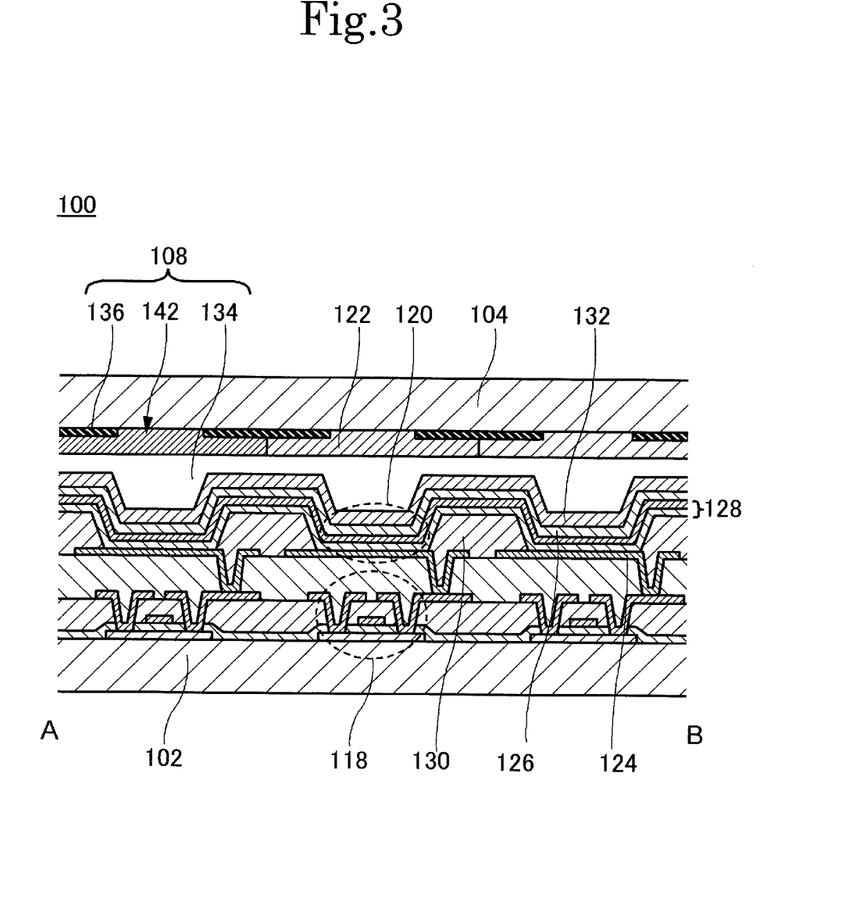
FIG. 3 is a cross-sectional view showing the structure of the display device in the embodiment according to the present invention.
Figure 4:
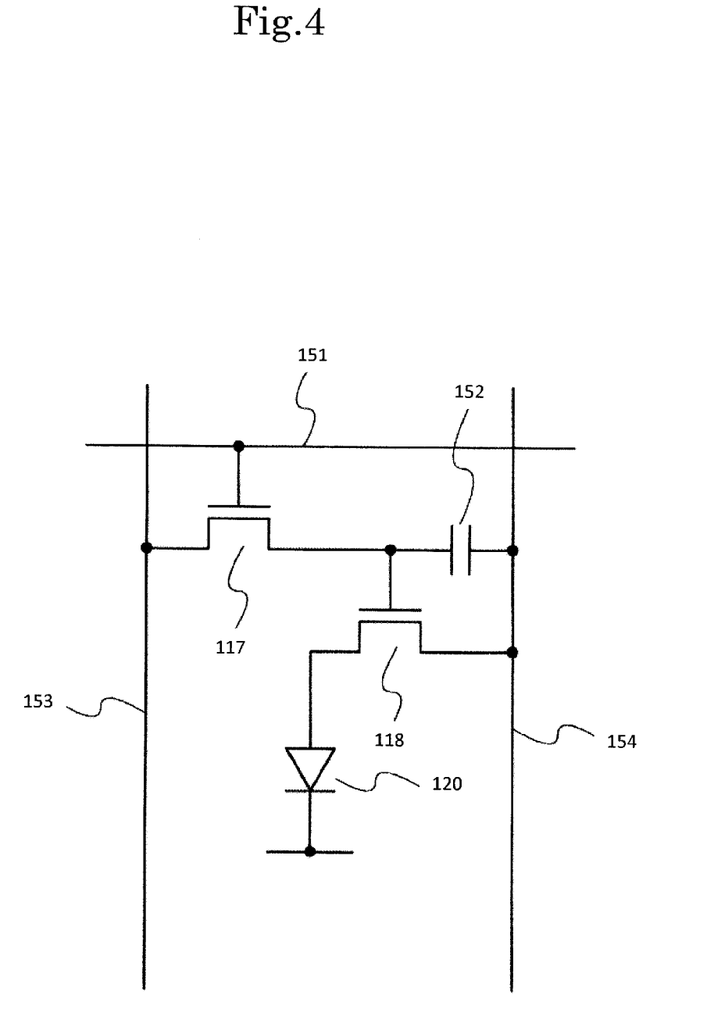
FIG. 4 is an equivalent circuit diagram of the display device in the embodiment according to the present invention.

With reference to FIG. 2 through FIG. 4, the structure of the display device 100 in this embodiment will be described. FIG. 2 is a plan view showing the structure of the display device 100 in this embodiment. FIG. 3 is a cross-sectional view showing the structure of the display device 100 in this embodiment. FIG. 4 is an equivalent circuit diagram of the display device 100 in this embodiment.

As shown in FIG. 2, the display region 106, on the first substrate 102, which forms a display screen includes the plurality of pixels 108 arrayed in a first direction L1 (row direction) and a second direction L2 (column direction). In a peripheral area of the first substrate 102, other elements such as a vertical scanning circuit, a horizontal scanning circuit and the like that input signals to the display region 106 may be provided.

FIG. 3 is a cross-sectional view of one pixel of the display device 100 taken along line A-B in FIG. 2. The plurality of pixels 108 each include a plurality of light emitting regions. The plurality of light emitting regions are separated from each other by a bank 130 provided so as to surround the light emitting regions. The plurality of light emitting regions each form a sub pixel 144 (e.g., FIG. 5) including a selective transistor 117 (FIG. 4), a light emitting element 120 emitting white light, and a color filter 122 of red, green, blue or white provided above the light emitting element 120. The sub pixel 144 emits light of one of these colors.

The light emitting element 120 includes an individual pixel electrode 124 (also referred to simply as a "pixel electrode"), an organic layer 128, and a common pixel electrode 126 (also referred to as a "common electrode"), which are stacked in this order. One individual pixel electrode 124 is independently provided in each light emitting element 120. The individual pixel electrode 124 is supplied with a potential via a driving transistor 118. The individual pixel electrodes 124 in different sub pixels 144 are supplied with different potentials. The organic layer 128 includes a light emitting layer. The common pixel electrode 126 is commonly provided for all the light emitting elements 120.

The individual pixel electrode 124 is preferably formed of a material having a high reflectance (e.g., a metal film) in order to allow light generated in the organic layer 128 to be reflected toward the common pixel electrode 126. Alternatively, the individual pixel electrode 124 may have a stack structure of a metal film and a transparent conductive film, so that the individual pixel electrode 124 includes a light-reflective surface.

The organic layer 128 is commonly provided for the plurality of pixels 108 and covers the individual pixel electrodes 124 and the bank 130 between the sub pixels 144. The organic layer 128 may be provided commonly for all the light emitting elements 120 as shown in FIG. 3, or one organic layer 128 may be independently provided on each individual pixel electrode 124 for each of the colors.

As shown in FIG. 3, the bank 130 covers a peripheral area of the individual pixel electrode 124. The organic layer 128 and the common pixel electrode 126 are provided on a top surface of the individual pixel electrode 124 and continuously on a top surface of the bank 130. In the light emitting element 120, a region where the individual pixel electrode 124, the organic layer 128 and the common pixel electrode 126 overlap each other may be regarded as a light emitting region. The bank 130 isolates the organic layer 128 and the common pixel electrode 126 from the individual pixel electrode 124 at the peripheral area of the individual pixel electrode 124. Because of this structure, the bank 130 may be regarded as demarcating the light emitting region.

In the case of being formed of, for example, an organic EL material, the organic layer 128 is formed of a low molecular weight type organic material or a high molecular weight type organic material. In the case where a low molecular weight type organic material is used, the organic layer 128 includes the light emitting layer, a hole injection layer, a hole transfer layer, an electron transfer layer, an electron injection layer and the like. The light emitting layer is sandwiched by the hole injection layer/hole transfer layer and the electron transfer layer/electron injection layer. In this embodiment, the light emitting layer is formed of a light emitting material that emits white light, and full-color display is realized by color filters. The organic layer 128 may have a so-called tandem structure including a stack of a plurality of light emitting layers (e.g., EL layers). In FIG. 3, the organic layer 128 includes two layers provided in a stacked manner. The organic layer 128 is not limited to having such a structure, and the organic layer 128 may include three or more layers provided in a stacked manner, or another organic layer may be provided between such a plurality of layers.

The common pixel electrode 126 is preferably formed of a transparent conductive material that is light-transmissive and conductive such as ITO (tin oxide-containing indium oxide), IZO (indium oxide-zinc oxide) or the like in order to allow light emitted in the light emitting layer to be transmitted through the common pixel electrode 126. Alternatively, the common pixel electrode 126 may be formed of a metal layer having such a thickness that allows the light emitted in the light emitting layer to be transmitted through the metal layer.

A sealing film 132 is provided on the common pixel electrode 126. The sealing film 132 is preferably an insulating film that blocks entrance of moisture. Such an insulating film may be an inorganic insulating film or an organic insulating film.

In the case where the sealing film 132 is formed of an inorganic insulating film, the sealing film 132 may be formed of silicon oxide ($SiO_x$), silicon nitride ($SiN_x$), silicon oxide nitride ($SiO_xN_y$), silicon nitride oxide ($SiN_xO_y$), aluminum oxide ($AlO_x$), aluminum nitride ($AlN_x$), aluminum oxide nitride ($AlO_xN_y$), aluminum nitride oxide ($AlN_xO_y$) or the like (x and y are each an arbitrary value). The sealing film 132 may have a stack structure of any of these materials. The sealing film 132 formed of such an inorganic material(s) may be formed by plasma CVD or sputtering.

In the case where the sealing film 132 is formed of an organic insulating film, the sealing film 132 may be formed of a polyimide resin, an acrylic resin, an epoxy resin, a silicone resin, a fluorine resin, a siloxane resin or the like. The sealing film 132 may have a stack structure of any of these materials. The sealing film 132 formed of such an organic material(s) may be formed by vapor deposition or vapor deposition polymerization.

The sealing film 132 may have a stack structure of a combination of any of the above-described inorganic and organic insulating materials.

The first substrate 102 is covered with the second substrate 104, which is transparent and is kept away from the first substrate 102 by the sealing member 110 (see FIG. 1). A space enclosed by the second substrate 104, the sealing member 110, and the sealing film 132 may be filled with a filler 134 formed of, for example, an epoxy resin, which is transparent. The second substrate 104, which faces the first substrate 102, is also referred as a "counter substrate".

Although not shown in FIG. 2, the display region 106 is covered with a light blocking layer 136 (FIG. 3) having a plurality of openings 142 (FIG. 3). For the sake of convenience, the openings 142 will be referred to as a "pixel opening 142". The light blocking layer 136 is located above the color filters 122 (on the side of the second substrate 104). The plurality of pixel openings 142 in the light blocking layer 136 allow light from the light emitting regions to be output.

The pixel 108 includes a plurality of the sub pixels 144. The pixel openings 142 are provided in correspondence with the sub pixels 144.

In FIG. 2, the pixel 108 is a region enclosed by the dashed lines. The pixel 108 is divided into four regions, and each of the four regions is one sub pixel 144. Needless to say, the pixel 108 does not need to be divided into four regions. In the case where four colors of RGBW are used for display, the pixel 108 is divided into four regions. In the case where three colors of RGB are used for display, the pixel 108 is divided into three regions. The pixel 108 may be divided into two or more regions.

FIG. 4 is an equivalent circuit diagram of the sub pixel 144 shown in FIG. 3. When a selection signal is supplied to a gate signal line 151, the selective transistor 117 supplies a data signal, supplied from a data signal line 153 in synchronization with the selection signal, as a gate potential of the driving transistor 118. A capacitance element 152 maintains the gate potential. The driving transistor 118 is connected with a power supply line 154 and supplies a drain current based on the gate potential to the light emitting element 120. The light emitting element 120 emits light at a luminance based on the drain current.

The equivalent circuit diagram shown in the layout of FIG. 4 and the pixel structure shown in FIG. 3 are each one example, and the display device according to the present invention is not limited to having such a pixel structure or such a circuit configuration. For example, a circuit compensating for the threshold voltage of the driving transistor 118 or a switching transistor forcibly terminating the light emission of the light emission element 120 may also be included.

<Sub Pixel Array Example 1>

Figure 5:
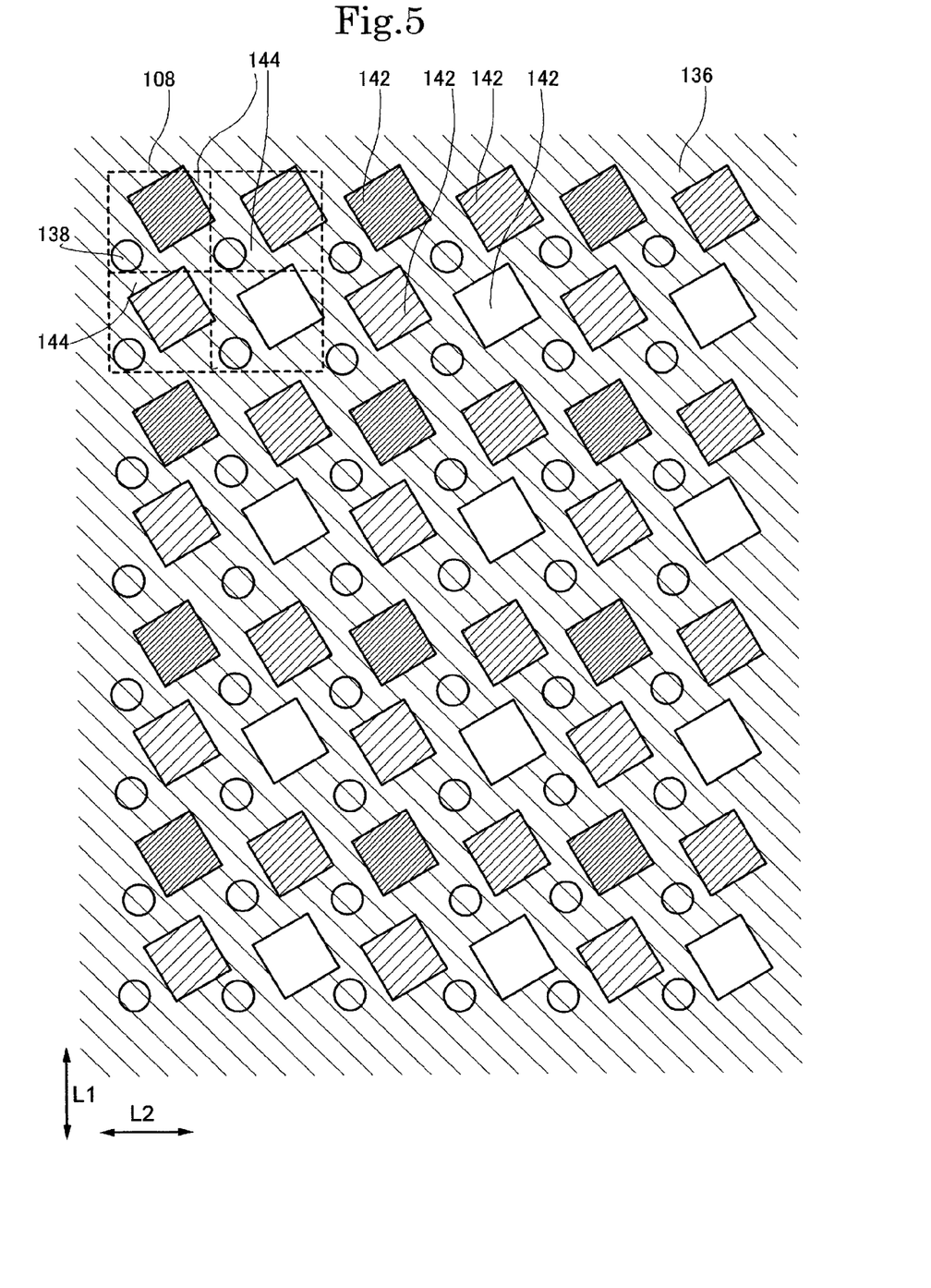
FIG. 5 is a plan view showing an array of pixels provided in the display device in the embodiment according to the present invention.

With reference to FIG. 5, a shape of the pixel openings 142 in one example according to the present invention will be described. FIG. 5 shows the positions and the shapes of the pixel openings 142 and contact holes 138. FIG. 5 is a schematic view, and the contact holes 138 are not exposed in actuality. In FIG. 5, the pixel openings 142 in the light blocking layer 136 are generally quadrangular.

The pixel openings 142 are quadrangular in this example, but are not limited to being quadrangular. For example, the pixel openings 142 may be circular. However, if the pixel openings 142 are polygonal, for example, pentagonal, the total length of the sides of each pixel opening 142 is long with respect to the area size thereof, which is not suitable for production. Therefore, the pixel openings 142 are preferably generally quadrangular, circular or the like. In the case of being quadrangular, the pixel openings 142 do not need to be square as shown in FIG. 5, and may be generally rectangular. The pixel openings 142 are preferably close to square because a square is highly symmetrical and thus is desirable from the point of view of external light reflection. The pixel openings 142 do not need to have corners formed of straight lines, and the corners may be formed of a curve having a certain curvature.

In this example, the pixel openings 142 are each rotated and inclined with respect to the sub pixel 144 having a quadrangular shape represented by the dashed line. As can be understood from FIG. 5, lines connecting the centers of the pixel openings 142 of the sub pixels 144 adjacent to each other in the first direction L1, and lines connecting the centers of the contact holes 138 of the sub pixels 144 adjacent to each other in the first direction L1, are generally parallel to the first direction L1. Similarly, lines connecting the centers of the pixel openings 142 of the sub pixels 144 adjacent to each other in the second direction L2, and lines connecting the centers of the contact holes 138 of the sub pixels 144 adjacent to each other in the second direction L2, are generally parallel to the second direction L2.

A straight line extended from each of sides of each pixel opening 142 has an angle with respect to both of the first direction L1 and the second direction L2. In the plan view of FIG. 5 (schematic view), the pixel openings 142 are seen as being inclined. The inclination, namely, the angle of the extended line with respect to each of the first direction L1 and the second direction L2 may have any value from 0 degrees to 90 degrees. Preferably, among an angle of each side of each opening 142 with respect to the first direction L1 and an angle of each side of each opening 142 with respect to the second direction L2, a smaller angle is 0 degrees or larger and smaller than 45 degrees. A reason for this is that the external light reflection (flicker; described below) in the pixel opening 142 has dependence on this angle. In the case where the pixel openings 142 are quadrangular, a preferable value of the inclination (angle) varies in accordance with the resolution.

In the case where, for example, the pixel openings 142 may be formed to be small to some extent, the diagonal lines of each quadrangular pixel opening 142 are sufficiently short. Therefore, the angle may be close to 45 degrees to increase the density of the pixel openings 142, so that high definition display is realized. In this case, the degree of symmetry of the pixel openings 142 is high, and therefore, the external light reflection is decreased as described below. In addition, the length at which two adjacent sides of two adjacent pixel openings 142 face each other is shortened. Therefore, the optical color mixing is suppressed.

In this example, such an array structure allows the pixel openings 142 to be symmetrical. Therefore, the spatial frequency for reflected light is increased. As a result, the contrast of a striped pattern provided by the external light reflection is decreased, and thus the striped pattern becomes less recognizable visually. Herein, the "spatial frequency" is defined as the number of times of repetition per degree of visual angle, and the unit thereof is cpd (cycle per degree). In this specification, the "spatial frequency" is the number of repetition of the pixel openings 142 per degree of visual angle (or simply, the number of the pixel openings 142 per degree of visual angle). The contrast of the striped pattern caused by the external light reflection is decreased by an increase in the spatial frequency by the following mechanism. The state in which the width of the pixel opening 142 is significantly varied in accordance with the position thereof is alleviated and therefore, the dependence of the striped pattern, caused by the external light reflection, on the visual angle is decreased.

The length at which two adjacent sides of two adjacent pixel openings 142 face each other is short. Therefore, the phenomenon that output light enters a color filter adjacent to the color filter corresponding to the output light is alleviated, and thus the optical color mixing is prevented for the following reason. In the case where the sides of the pixel openings 142 are close to each other, light colliding against, for example, an inclining surface of the bank is output toward the color filter of a sub pixel 144 adjacent to the corresponding sub pixel 144. In the case where the length at which two adjacent sides of two adjacent pixel openings 142 face each other is short, such a phenomenon is alleviated.

The pixel openings 142 in the light-blocking layer 136 may be generally quadrangular, and therefore, are formed to have the same shape stably during the production of the display device 100. Since the pixel openings 142 are quadrangular, the total length of the sides of the pixel openings 142 with respect to a certain area size is decreased. This prevents size variance during the production.

Even though the pixel openings 142 in the light-blocking layer 136 are generally quadrangular, the contact holes 138 are allowed to be formed in an area other than the pixel openings 142 in the light-blocking layer 136. Thus, the contact holes 138 do not overlap the pixel openings 142. This improves the reflection characteristics.

Regarding the shape of the pixel openings 142, a generally quadrangular shape is advantageous over a circular shape in terms of increasing the numerical aperture. However, it is difficult to form the pixel openings 142 with a perfect quadrangular shape because of the production method. Thus, in this specification, the term "quadrangular" refers to "generally quadrangular", not "perfectly quadrangular".

<Sub Pixel Array Example 2>

Figure 6:
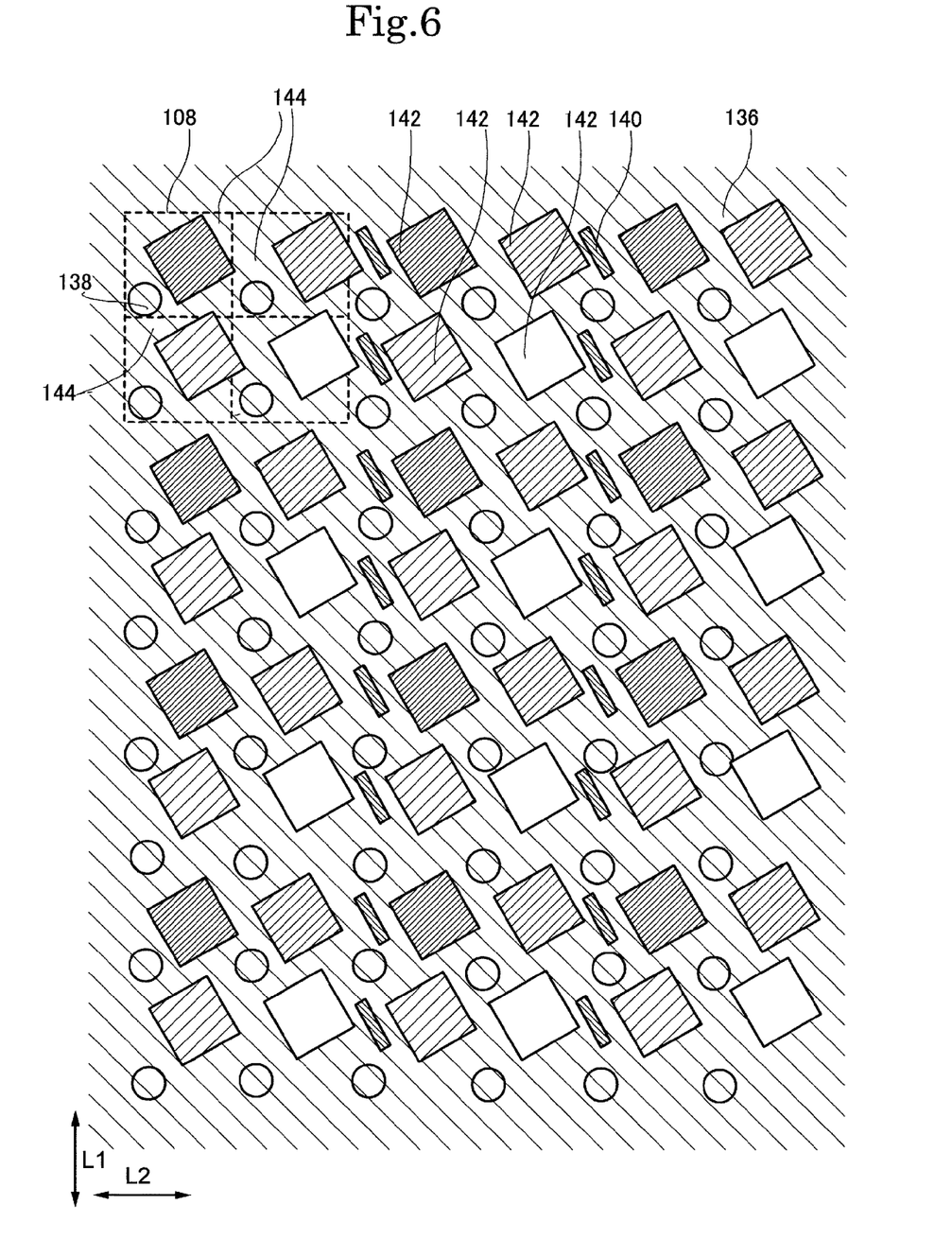
FIG. 6 is a plan view showing an array of pixels provided in a display device in an embodiment according to the present invention.
Figure 7:
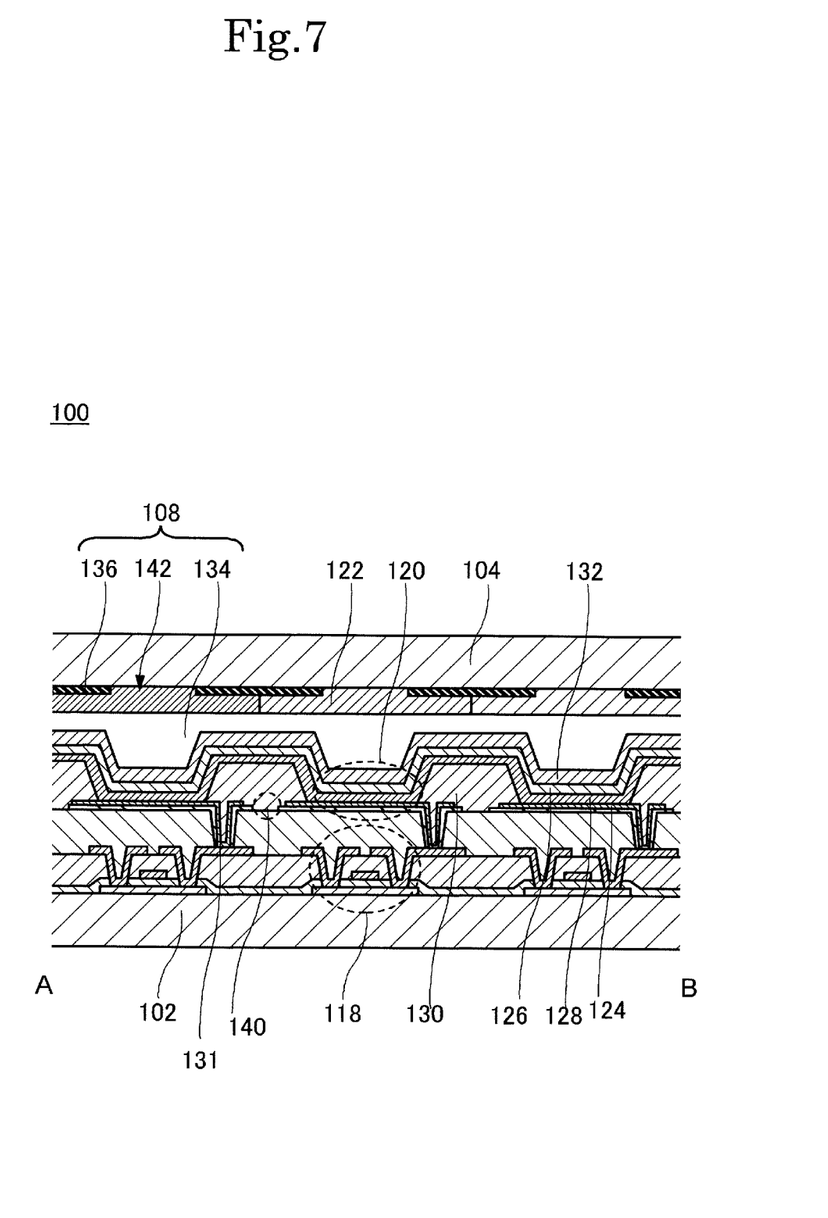
FIG. 7 is a cross-sectional view showing a position of an insulating layer opening provided in the display device in the embodiment according to the present invention.

FIG. 6 shows a shape of the pixel openings 142 in one example according to the present invention. FIG. 7 is a cross-sectional view showing a structure of the display device 100 in this example. In this example, insulating layer openings 140 are provided in addition to the pixel openings 142 and the contact holes 138.

In this example, the shape of the pixel openings 142 and the positions of the contact holes 138 are the same as in sub pixel array example 1. Also like in sub pixel array example 1, the contact holes 138 are not exposed actually.

In this example, a flattening layer may be provided on the driving transistor in order to compensate for the convexed and concaved pattern of source electrodes and drain electrodes of the driving transistors 118. On the flattening film, an insulating layer 131 is provided. The insulating layer 131 has insulating film openings 140, through which the bank 130 and the flattening film contact each other without the insulating film 131 being provided therebetween. The insulating film openings 140 are located at positions shown in FIG. 6. The insulating film openings 140 are provided for the following purpose. Moisture that is used in a lithography step or the like (performed for, for example, removing a resist or the like) during the production may remain on the flattening film or the like provided on the transistor 118 and may be kept thereon by the insulating layer 131, which does not allow permeation of moisture. When this occurs, the transistor 118 or the like may be deteriorated. The insulating film openings 140 are provided to prevent this.

The shape of the pixel openings 142 in the light-blocking layer 136 shown in FIG. 6 are generally quadrangular. The shape of the pixel openings 142 is not limited to this. As described above, the pixel openings 142 do not need to have corners formed of straight lines, and the corners may be formed of a curve having a certain curvature. In this example, the pixel openings 142 are each rotated and inclined with respect to the sub pixel 144 having a quadrangular shape represented by the dashed line. Such a shape is the same as in sub pixel array example 1 described above.

The insulating layer openings 140 in this example are provided between the pixels 108 adjacent to each other. In FIG. 6, the insulating layer openings 140 are provided between the pixels 108 adjacent to each other in the second direction L2. Alternatively, the insulating layer openings 140 may be provided between the pixels 108 adjacent to each other in the first direction L1.

In this example, such an array structure allows the pixel openings 142 to be symmetrical. The length at which two adjacent sides of two adjacent pixel openings 142 face each other is short. Therefore, the optical color mixing is prevented for the reason described above. The pixel openings 142 in the light-blocking layer 136 may be generally quadrangular, and therefore, are formed to have the same shape stably during the production of the display device 100. Since the pixel openings 142 are quadrangular, the total length of the sides of the pixel openings 142 with respect to a certain area size is decreased. This prevents size variance during the production. Even though the pixel openings 142 in the light-blocking layer 136 are generally quadrangular, the contact holes 138 are allowed to be formed in an area other than the pixel openings 142 in the light-blocking layer 136. Thus, the contact holes 138 do not overlap the pixel openings 142. This improves the reflection characteristics.

As shown in FIG. 7, the insulating layer openings 140 are provided, through which the flattening film and the bank 130 are in contact with each other. Therefore, moisture or gas used in steps of photolithography, heat treatment or like after the bank 130 is formed are extracted from the flattening film via the bank 130. Thus, the display device 100 is prevented from being deteriorated.

<Sub Pixel Array Example 3>

Figure 8:
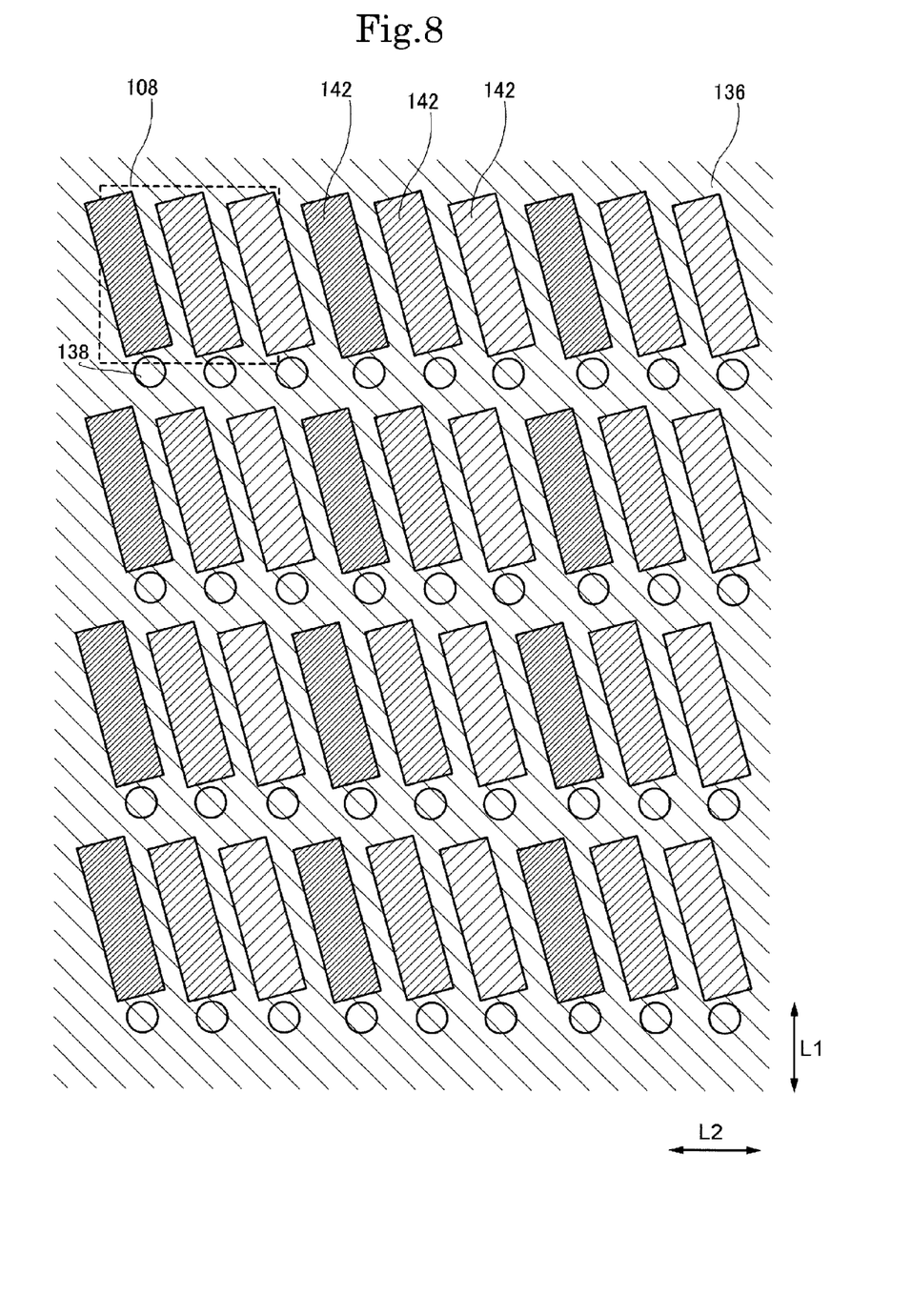
FIG. 8 is a plan view showing an array of pixels provided in a display device in an embodiment according to the present invention.

With reference to FIG. 8, an array of the pixel openings 142 in one example according to the present invention will be described. In this example, each pixel 108 includes three pixel openings 142. In this case also, lines connecting the centers of the pixel openings 142 of the sub pixels 144 adjacent to each other in the first direction L1, and lines connecting the centers of the contact holes 138 of the sub pixels 144 adjacent to each other in the first direction L1, are generally parallel to the first direction L1. Similarly, lines connecting the centers of the pixel openings 142 of the sub pixels 144 adjacent to each other in the second direction L2, and lines connecting the centers of the contact holes 138 of the sub pixels 144 adjacent to each other in the second direction L2, are generally parallel to the second direction L2.

In sub pixel array example 3 also, such an array structure prevents the optical color mixing. The pixel openings 142 in the light-blocking layer 136 may be generally quadrangular, and therefore, are formed to have the same shape stably during the production of the display device 100. Since the pixel openings 142 are quadrangular, the total length of the sides of the pixel openings 142 with respect to a certain area size is decreased. This prevents size variance during the production. The length at which two adjacent sides of two adjacent pixel openings 142 face each other is short. Therefore, the optical color mixing is prevented. Even though the pixel openings 142 in the light-blocking layer 136 are generally quadrangular, the contact holes 138 are allowed to be formed in an area other than the pixel openings 142 in the light-blocking layer 136. Thus, the contact holes 138 do not overlap the pixel openings 142. This improves the reflection characteristics.

<Sub Pixel Array Example 4>

Figure 9:
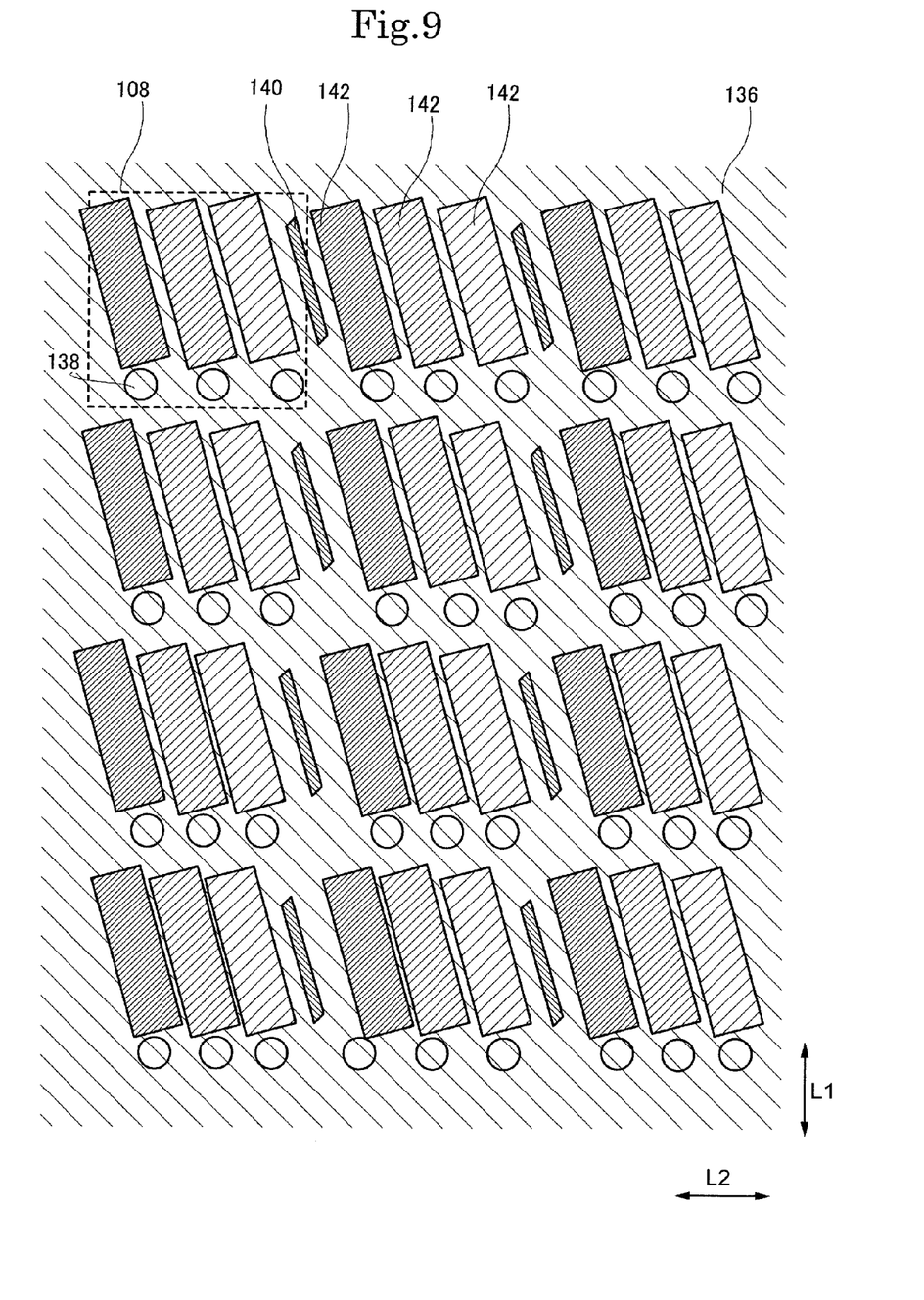
FIG. 9 is a plan view showing an array of pixels provided in a display device in an embodiment according to the present invention.

The structure in sub pixel array example 3 may be provided with the insulating film openings 140. In this case, as shown in FIG. 9, the insulating film openings 140 are provided between the pixels 108 adjacent to each other in the second direction L2.

In sub pixel array example 4, the pixels 108 adjacent to each other are distanced from each other. This prevents the optical color mixing. The pixel openings 142 in the light-blocking layer 136 may be generally quadrangular, and therefore, are formed to have the same shape stably during the production of the display device 100. Since the pixel openings 142 are quadrangular, the total length of the sides of the pixel openings 142 with respect to a certain area size is decreased. This prevents size variance during the production. The length at which two adjacent sides of two adjacent pixel openings 142 face each other is short. Therefore, the optical color mixing is prevented. Even though the pixel openings 142 in the light-blocking layer 136 are generally quadrangular, the contact holes 138 are allowed to be formed in an area other than the pixel openings 142 in the light-blocking layer 136. Thus, the contact holes 138 do not overlap the pixel openings 142. This improves the reflection characteristics.

The display device 100 in a preferable embodiment according to the present invention has been described. In this embodiment, the display device 100 providing high definition display is provided.

The above-described embodiments and examples are merely examples, and the technological scope of the present invention is not limited to any of the above-described embodiments or examples. A person of ordinary skill in the art would make various alterations without departing from the gist of the present invention. Therefore, such alterations are to be construed to be encompassed in the technological scope of the present invention.

The invention claimed is:

1. A display device having a display region including a plurality of pixels arranged in a first direction and a second direction crossing the first direction on a substrate, each of the plurality of pixels comprises:
a transistor on the substrate;
a pixel electrode; and
a contact portion connecting one of a source electrode and a drain electrode of the transistor and the pixel electrode,
a flattening layer is between the transistor and the pixel electrode, and covers the transistor,
an insulating layer is between the flattening layer and the pixel electrode, and has an opening,
a bank layer is on the pixel electrode and the insulating layer, and covers an edge of the pixel electrode and the opening of the insulating layer, and
the bank layer has an opening exposing an upper surface of the pixel electrode, wherein
the contact portion has a contact hole through the flattening layer and the insulating layer,
the flattening layer and the bank layer are directly in contact with each other at the opening of the insulating layer,
the contact portion and the opening of the insulating layer are arranged in line along one of the first direction and the second direction, and
the opening of the insulating layer and the opening of the bank layer are arranged in line along another one of the first direction and the second direction.

2. The display device according to claim 1, wherein the contact portion and the opening of the insulating layer are not arranged in line along the another one of the first direction and the second direction.

3. The display device according to claim 1, wherein the opening of the insulating layer and the opening of the bank layer are not arranged in line along the one of the first direction and the second direction.

4. The display device according to claim 1, wherein the opening of the bank layer has a first side and the second side crossing the first side,
each of the first side and the second side has an angle with respect to both of the first direction and the second direction.

5. The display device according to claim 1, further comprising:
an organic layer on the pixel electrode and covering the upper surface of the pixel electrode; and
a common pixel electrode on the organic layer commonly covering the plurality of pixels.

6. The display device according to claim 1, further comprising:
a plurality of data signal lines extending along the first direction and arranged along the second direction; and
a plurality of gate signal lines extending along the second direction and arranged along the first direction.

* * * * *